United States Patent
Chern et al.

(10) Patent No.: US 8,716,128 B2
(45) Date of Patent: May 6, 2014

(54) METHODS OF FORMING THROUGH SILICON VIA OPENINGS

(75) Inventors: Chyi Shyuan Chern, Taipei (TW);
Hsin-Hsien Wu, Hsinchu (TW);
Chun-Lin Chang, Jhubei (TW);
Hsing-Kuo Hsia, Jhubei (TW); Hung-Yi Kuo, Taipei (TW)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 313 days.

(21) Appl. No.: 13/086,542

(22) Filed: Apr. 14, 2011

(65) Prior Publication Data

US 2012/0264296 A1  Oct. 18, 2012

(51) Int. Cl.
*H01L 21/768* (2006.01)

(52) U.S. Cl.
USPC ............... 438/660; 257/E21.597; 219/121.69

(58) Field of Classification Search
USPC ........... 438/660, 667, 675, 680; 257/E21.597
See application file for complete search history.

(56) References Cited

U.S. PATENT DOCUMENTS

| | | | |
|---|---|---|---|
| 4,478,677 A | 10/1984 | Chen et al. | |
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine et al. | |
| 6,664,129 B2 | 12/2003 | Siniaguine et al. | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 2010/0164117 A1* | 7/2010 | Chen ............................. 257/774 |
| 2010/0240218 A1* | 9/2010 | Ugajin ......................... 438/706 |
| 2010/0244247 A1* | 9/2010 | Chang et al. .................. 257/741 |
| 2012/0168412 A1* | 7/2012 | Hooper .................... 219/121.69 |

* cited by examiner

*Primary Examiner* — Savitr Mulpuri
(74) *Attorney, Agent, or Firm* — Haynes and Boone, LLP

(57) ABSTRACT

A method of forming a through-silicon-via (TSV) opening includes forming a TSV opening through a substrate. A recast of a material of the substrate on sidewalls of the TSV opening is removed with a first chemical. The sidewalls of the TSV opening are cleaned with a second chemical by substantially removing a residue of the first chemical.

9 Claims, 5 Drawing Sheets

METHODS OF FORMING THROUGH SILICON VIA OPENINGS

TECHNICAL FIELD

The present disclosure relates generally to the field of semiconductor and, more particularly, to methods of forming through silicon via openings.

BACKGROUND

Since the invention of the integrated circuit, the semiconductor industry has experienced continual growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

Three-dimensional integrated circuits (3D IC) are therefore created to resolve the above-discussed limitations. In a conventional formation process of 3D IC, two wafers, each including an integrated circuit, are formed, The wafers are then bonded with the devices aligned. Deep vias are then formed to interconnect devices on the first and second wafers.

BRIEF DESCRIPTION OF THE DRAWINGS

The present disclosure is understood from the following detailed description when read with the accompanying figures. it is noted that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
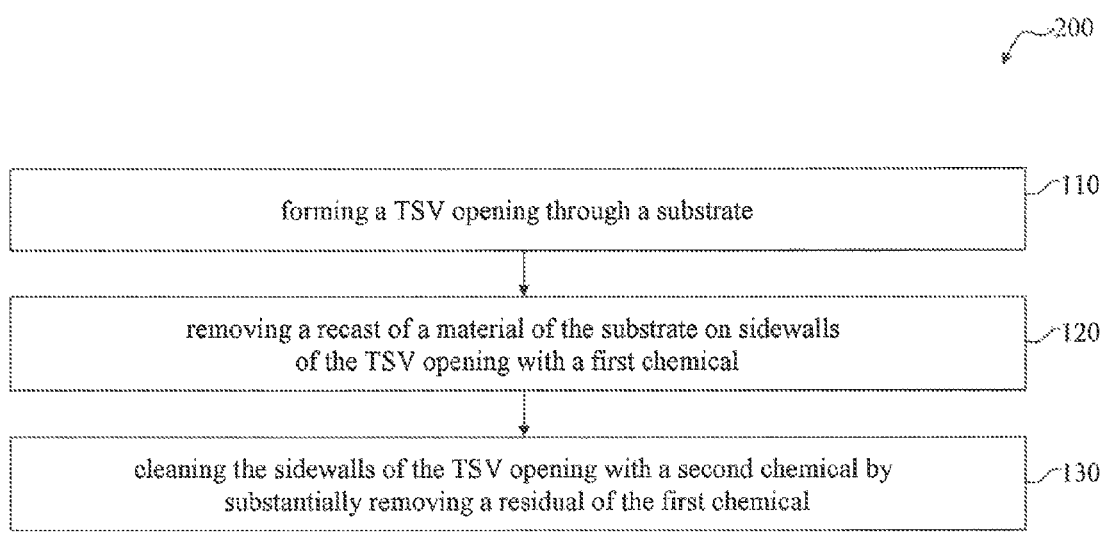
FIG. 1 is a flowchart of an exemplary method of forming a through-silicon-via (TSV) opening through a substrate.

A method known to the applicants for forming TSV openings for 3D IC uses silicon hexafluoride ions ($SiF_6^{2-}$) as an etching agent. It is found that the etching process results in the presence of scallops on sidewalls of the TSV openings. The step coverage of a liner or barrier/seed layer that is deposited on the scallop sidewalls of the TSV openings is impaired. The poor step coverage of the liner or barrier/seed layer damages electrical characteristics of conductive structures formed in the TSV openings.

Another method known to the applicants uses a laser ablation to remove silicon material of a silicon substrate, forming the TSV opening. However, it is found that the silicon particles and/or debris fall on the surface and sidewalls of the TSV openings, resulting in scallop-like roughened sidewall surfaces.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a flowchart of an exemplary method of forming a through-silicon-via (TSV) opening through a substrate. FIGS. 2A-2D are schematic cross-sectional views of forming a TSV opening in an integrated circuit during various fabrication stages. It is understood that FIGS. 1 and 2A-2D have been simplified for a better understanding of the concepts of the present disclosure. Accordingly, it should he noted that additional processes may he provided before, during, and after the methods of FIGS. 1 and 2A-2D, and that some other processes may only be briefly described herein.

Referring now to FIG. 1, the method 100 can include forming a TSV opening through a substrate (block 110). The method 100 can include removing a recast of a material of the substrate on the sidewalk of the TSV opening with a first chemical (block 120). The method 100 can also include cleaning the sidewalls of the TSV opening with a second chemical by substantially removing a residual of the first chemical (block 130).

Figure 2A:
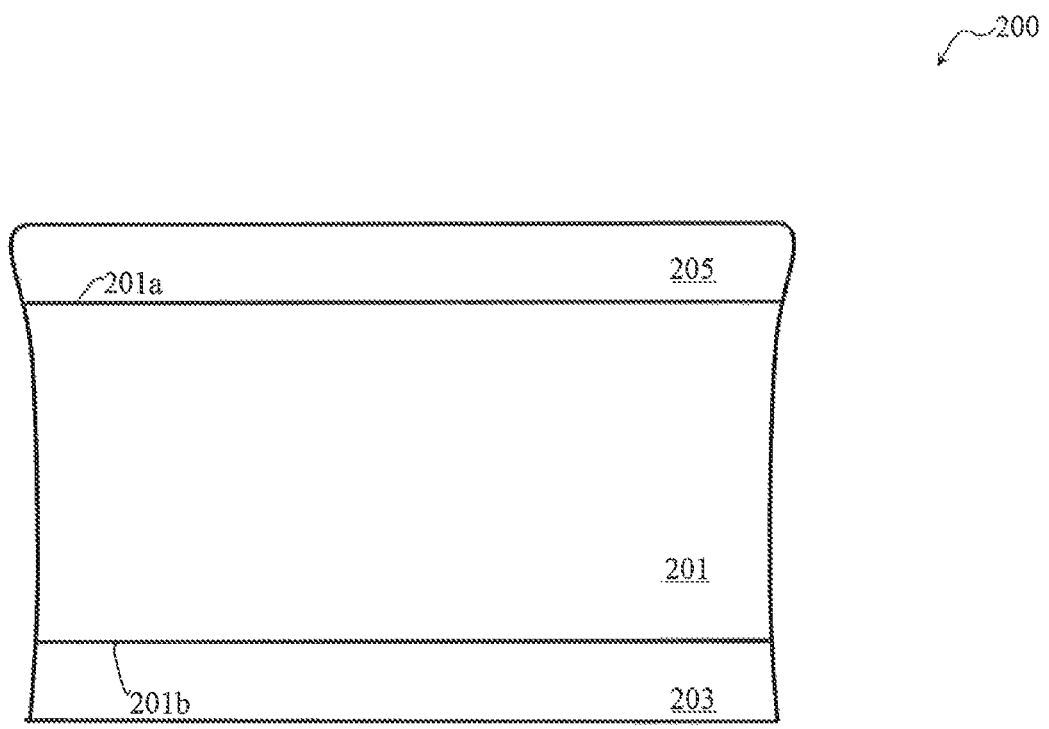
FIGS. 2A-2D are schematic cross-sectional views of forming a TSV opening in an integrated circuit during various fabrication stages.

For example, an integrated circuit 200 can include a substrate 201 as shown in FIG. 2A. In some embodiments, the integrated circuit 200 may include various passive and active microelectronic devices (not shown), such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, other types of transistors, and/ or any combinations thereof. In other embodiments, the integrated circuit 200 is used for light emitting diodes (LEDs).

In some embodiments, the substrate 201 may include an elementary semiconductor including silicon or germanium in crystal, polycrystalline, or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. In at least one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epitaxial (epi) layer or a buried layer. In other examples, the compound semiconductor substrate may have a multilayer structure, or the substrate may include a multilayer compound semiconductor structure.

Referring to FIG. 2A, in some embodiments a dielectric layer 205 can be formed over a surface 201a of the substrate 201. In other embodiments, a dielectric layer 203 can be formed adjacent to another surface 201b of the substrate 201. The dielectric layers 203 and 205 can each include at least one material, such as silicon oxide, silicon nitride, silicon oxynitride, silicon carbide, silicon oxycarbide, silicon oxynitride carbide, other dielectric materials and/or any combinations thereof. The dielectric layers 205 and 203 can protect the surfaces 201a and 201b, respectively, from being activated by a chemical during a removal process 220 described below in conjunction with FIG. 2C.

In some embodiments, the method 100 can optionally include coating a water soluble layer (not shown) over each of the dielectric layers 203 and/or 205. The water soluble layer is provided to prevent particles generated from a drilling process described below in conjunction with FIG. 2B falling on the dielectric layers 203 and 205.

Figure 2B:
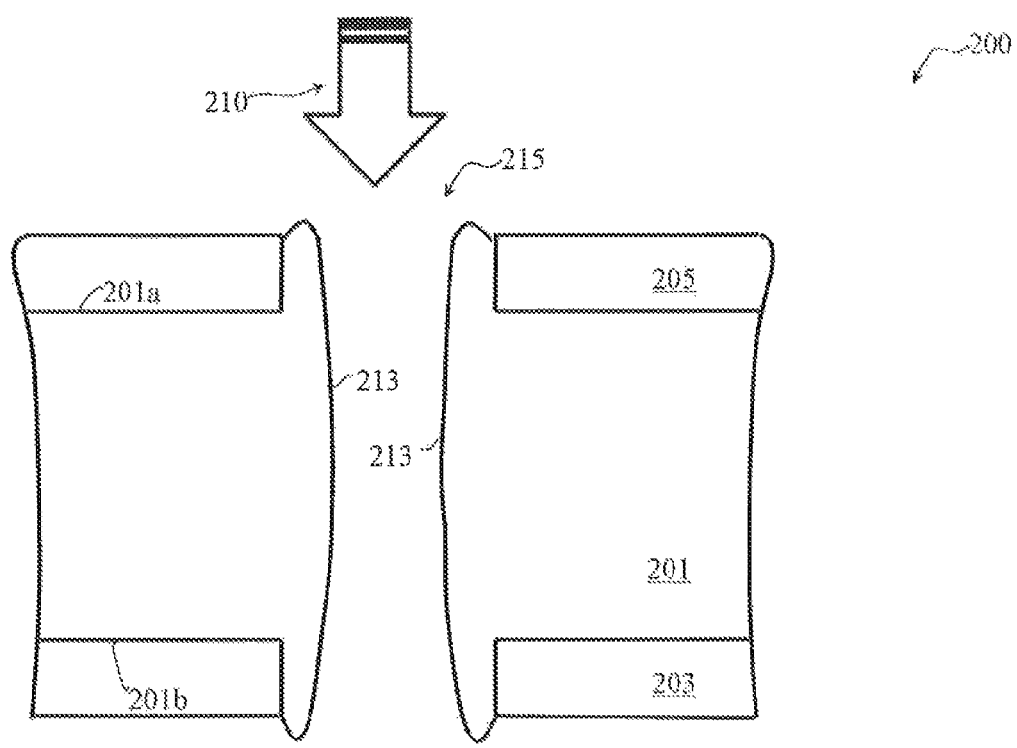

Referring to FIG. 2B, the method 100 can form a TSV opening 215 through the substrate 201. In some embodiments including the dielectric layers 203 and/or 205, the TSV opening 215 is also formed through the dielectric layers 203 and/or 205. The TSV opening 215 can be formed by, for example, a laser drilling, a mechanical drilling, a chemical etching process, or any other drilling processes. In some embodiments forming the TSV opening 215 by a laser drilling 210, the laser drilling 210 can use a laser having a wavelength of about 355 nanometer (nm) or less. The laser source can be a neodymium-doped yttrium aluminium garnet (Nd:YAG) laser source. The source power of the laser drilling 210 can be about 10.8 Watts or more. The laser drilling 210 can have a repetition rate of about 100 KHz and a pulse duration ranging from about 20 ns to about 75 ns. In some embodiments, the laser drilling 210 can be referred to as a laser ablation.

In some embodiments forming the TSV opening 215 by the laser drilling 210, a recast 213 can be formed on each sidewall of the TSV opening 215 as shown in FIG. 2B. During the laser drilling 210, the energy of the laser melts the material, e.g., silicon, of the substrate 201. The melted silicon is then cooled down, transforming into the amorphous silicon recasts 213. The TSV opening 215 having the recasts 213 on the sidewalls may cause an hourglass shape and/or rough sidewall surfaces.

Figure 2C:
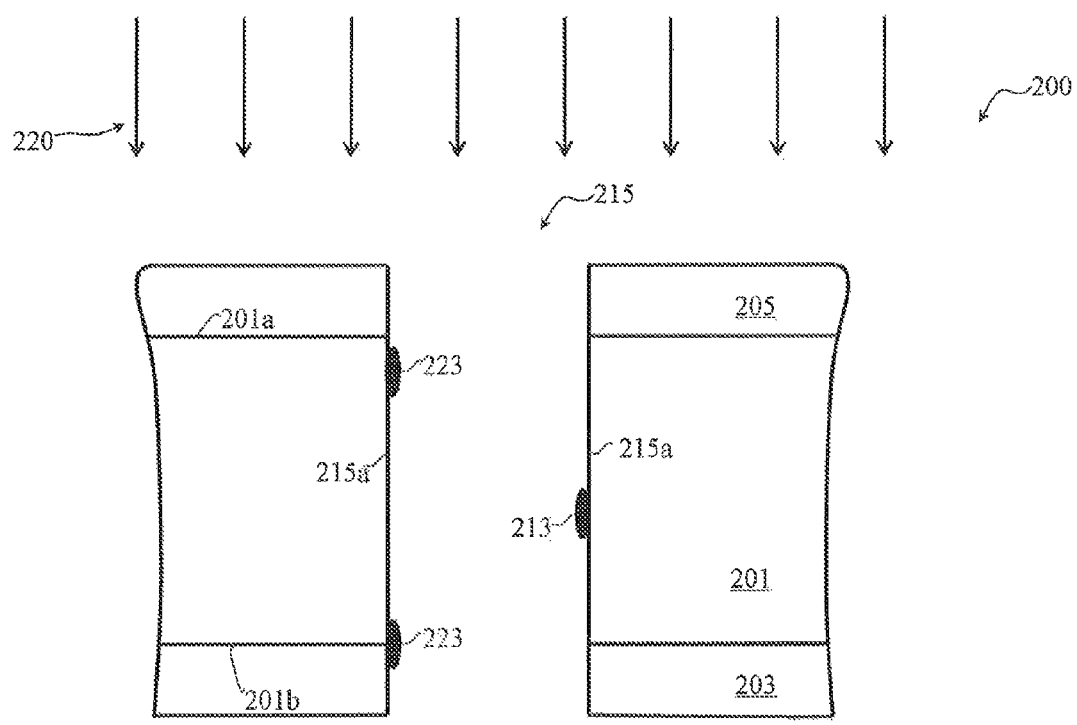

Referring to FIG. 2C, the method 100 can include a removal process 220 to remove the recasts 213 of the material of the substrate 201 on the sidewalls of the TSV opening 215 with a chemical. In some embodiments, the chemical can comprise a halogen-containing chemical, e.g., xenon difluoride ($XeF_2$), sulfur tetrafluoride sulfur hexafluoride ($SF_6$), other halogen-containing chemicals, and/or any combinations thereof. The halogen-containing chemical is provided to activate the recast 213 so as to substantially remove the recast 213 to smoothen the sidewalls 215a of the TSV opening 215. In some embodiments using $XeF_2$, the removal process 220 can have a flow rate of about 22 standard cubic centimeter per minute (sccm), a processing time of about 120 seconds or more, and a processing temperature of about 35° C. or more.

Though showing that the laser drilling 210 and the removal process 230 are performed in different steps, the scope of this application is not limited thereto. In some embodiments, the removal gas of the removal process 230 can be supplied during the laser drilling process.

As described above in conjunction with FIG. 2A, the method 100 can optionally include coating a water soluble layer (not shown) over the dielectric layers 203 and/or 205. As noted, particles and/or debris generated from the laser drilling 210 may be sputtered on the water soluble layer. In at least this embodiment, the method 100 can include a process to remove the water soluble layer with deionized water (DI water) so as to remove particles and/or debris on the water soluble layer.

Figure 2D:
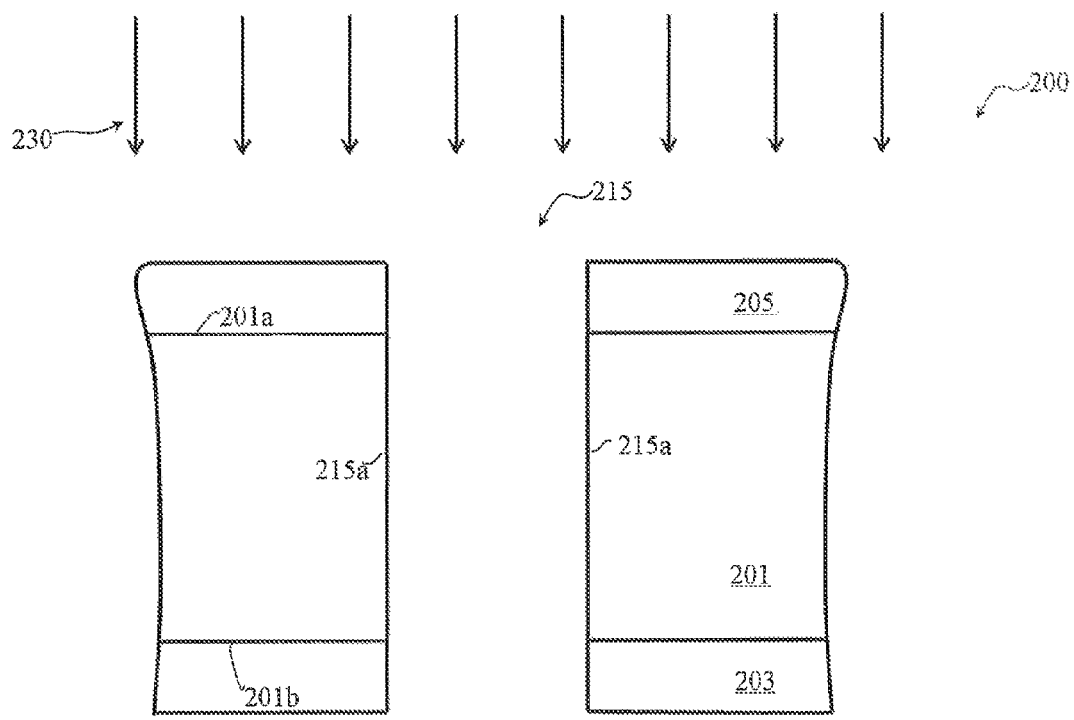

In some embodiments, during and/or after the removal process 220 at least one residual, e.g., residuals 223 may remain on the sidewalls 215a of the TSV opening 215 as shown in FIG. 2C. Referring to FIG. 2D, the method 100 can include a cleaning process 230 to clean the sidewalls 215a of the TSV opening 215 with a chemical by substantially removing the residual 223 (shown in FIG. 2C). For example, the residuals 233 may be halogen-containing residuals. In some embodiments, the chemical of the cleaning process 230 can include a first component that is substantially inactive with the material of the substrate 201 and a second component that is substantially active with the halogen component of the halogen-containing chemical. In other embodiments, the first component is selected from a group consisting of helium, neon, argon, krypton, xenon and radon, The second component comprises hydride.

For example, the chemical of the removal process 220 includes $XeF_2$. The chemical of the cleaning process 230 comprises xenon dihydride ($XeH_2$). The xenon component of $XeH_2$ is substantially inactive with the material of the substrate 201. The hydride component ($H^+$) of $XeH_2$ is substantially active with florid component ($F^-$) of $XeF_2$. The hydride component ($H^+$) of $XeH_2$ actively interacts with fluoride component ($F^-$) of $XeF_2$ to form hydrogen fluoride (HF) than can be easily taken away during the cleaning process 230. In some embodiments, the chemical of the cleaning process 230 can have a flow rate of about 3 standard cubic centimeter per minute (sccm) or more and a concentration of $XeH_2$ of about 20% or more by volume.

In some embodiments, after the cleaning process 230 a conductive structure (not shown) can be formed in the TSV opening 215. In some embodiments, the conductive structure can include, for example, a barrier material (e.g., titanium, titanium-nitride, tantalum, tantalum-nitride, other barrier materials, and/or combinations thereof), a conductive material (aluminum, copper, aluminum-copper, polysilicon, other conductive material, and/or combinations thereof), other material that are suitable for forming the conductive structure, and/or any combinations thereof.

In an embodiment of the application, a method of forming a through-silicon-via (TSV) opening includes forming a TSV opening through a substrate. A recast of a material of the substrate on sidewalls of the TSV opening is removed with a first chemical. The sidewalls of the TSV opening are cleaned with a second chemical by substantially removing a residue of the first chemical.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a through-silicon-via (TSV) opening, the method comprising:
   forming a TSV opening through a substrate;
   removing a recast of a material of the substrate on sidewalls of the TSV opening with a first chemical, wherein the first chemical comprises a halogen-containing chemical; and
   cleaning the sidewalls of the TSV opening with a second chemical by substantially removing a residue of the first chemical, wherein the second chemical comprises a first component that is substantially inactive with the material of the substrate and a second component that is substantially active with the halogen component of the halogen-containing chemical, and wherein the first component is selected from a group consisting of helium, neon, argon, krypton, xenon and radon, and wherein the second component comprises, wherein the second chemical comprises xenon dihydride (XeH2).

2. The method of claim 1, wherein forming the TSV opening comprises: laser drilling the substrate to form the TSV opening through the substrate, wherein the laser drilling process generates the recast on the sidewalls of the TSV opening.

3. The method of claim 2, further comprising: forming a dielectric layer over a surface of the substrate, wherein the laser drilling forms the TSV opening through the dielectric layer.

4. The method of claim 1, wherein the first chemical comprises at least one of xenon difluoride ($XeF_2$), sulfur tetrafluoride ($SF_4$) and sulfur hexafluoride ($SF_6$).

5. The method of claim 1, wherein the second chemical has a flow rate of about 3 standard cubic centimeter per minute (sccm) or more and a concentration of $XeH_2$ of about 20% or more by volume.

6. A method of forming a through-silicon-via (TSV) opening, the method comprising:
   laser drilling a substrate to form a TSV opening through the substrate, wherein the laser drilling process generates a recast of a material of the substrate on the sidewalls of the TSV opening;
   removing the recast on sidewalk of the TSV opening with a first chemical, wherein the first chemical comprises a halogen-containing chemical; and
   cleaning the sidewalls of the TSV opening with a second chemical by substantially removing a residual of the first chemical, wherein the second chemical comprises a first component that is substantially inactive with the material of the substrate and a second component that is substantially active with the halogen component of the halogen-containing chemical, and wherein the first component is selected from a group consisting of helium, neon, argon, krypton, xenon and radon, and wherein the second component comprises, wherein the second chemical comprises xenon dihydride (XeH2).

7. The method of claim 6, further comprising: forming a dielectric layer over a surface of the substrate, wherein the laser drilling forms the TSV opening through the dielectric layer.

8. The method of claim 6, wherein the first chemical comprises at least one of xenon difluoride ($XeF_2$), sulfur tetrafluoride ($SF_4$) and sulfur hexafluoride ($SF_6$).

9. The method of claim 6, wherein the second chemical has a flow rate of about 3 standard cubic centimeter per minute (sccm) or more and a concentration of $XeH_2$ of about 20% or more.

* * * * *